United States Patent
Luo et al.

(10) Patent No.: US 11,536,554 B2
(45) Date of Patent: Dec. 27, 2022

(54) LOCALIZATION AND ATTITUDE ESTIMATION METHOD USING MAGNETIC FIELD AND SYSTEM THEREOF

(71) Applicant: INDUSTRIAL TECHNOLOGY RESEARCH INSTITUTE, Hsinchu (TW)

(72) Inventors: Sheng-Wen Luo, Kaohsiung (TW); Shih-Ho Hsieh, Taipei (TW); Jwu-Sheng Hu, Zhubei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 751 days.

(21) Appl. No.: 16/234,160

(22) Filed: Dec. 27, 2018

(65) Prior Publication Data

US 2020/0149862 A1    May 14, 2020

(30) Foreign Application Priority Data

Nov. 14, 2018   (TW) .................................. 107140436

(51) Int. Cl.
    *G05D 1/10*       (2006.01)
    *G05D 1/02*       (2020.01)
    (Continued)

(52) U.S. Cl.
    CPC ............. *G01B 7/004* (2013.01); *G01C 21/20* (2013.01); *G01R 33/0206* (2013.01); *G05D 1/0259* (2013.01); *G05D 1/101* (2013.01)

(58) Field of Classification Search
    CPC . G01B 7/004; G01B 7/30; G01B 7/00; G05D 2201/0216; G05D 1/0259;
    (Continued)

(56) References Cited

U.S. PATENT DOCUMENTS 6,269,291 B1    7/2001   Segeren
6,690,963 B2 *  2/2004   Ben-Haim ............. A61B 5/145
                                                         600/424
(Continued)

FOREIGN PATENT DOCUMENTS

CN    102147259 A    8/2011
CN    102686979 B    2/2015
(Continued)

OTHER PUBLICATIONS

Hu (Hu, Chao et al., "A Cubic 3-Axis Magnetic Sensor Array for Wirelessly Tracking Magnet Position and Orientation," IEEE Sensors Journal, vol. 10, No. 5, May 2010, pp. 903-913.). (Year: 2010).*

(Continued)

*Primary Examiner* — Jeffrey P Aiello
(74) *Attorney, Agent, or Firm* — Birch, Stewart, Kolasch & Birch, LLP

(57) ABSTRACT

A localization and attitude estimation method using magnetic fields includes the following steps. First, in three-dimensional coordinates, at least three magnetic landmarks arbitrarily disposed around a moving carrier are selected, wherein any two of the at least three magnetic landmarks have different magnetic directions. One set of at least five tri-axes magnetic sensors is used to sense the magnetic fields of the at least three magnetic landmarks. Three magnetic components on three axes of a current position of each of the tri-axes magnetic sensors are respectively generated by a demagnetization method. Five non-linear magnetic equations are solved to obtain position information and magnetic moment information of the at least three magnetic landmarks in the three-dimensional coordinates. Position vectors and attitude vectors of the set of at least five tri-axes magnetic sensors in a three-dimensional space are estimated (Continued)

based on tri-axes magnetic moment vectors of the magnetic landmarks.

6 Claims, 3 Drawing Sheets

(51) Int. Cl.
  *G01R 33/02* (2006.01)
  *G01C 21/20* (2006.01)
  *G01B 7/004* (2006.01)

(58) Field of Classification Search
  CPC ...... G01C 21/04; G01C 21/20; G01C 21/165; G01C 21/206; G01R 33/0206; A61B 34/20; A61B 2034/2051
  USPC ....... 73/1.77, 514.31; 701/408, 501; 702/94, 702/150–153, 141, 104, 73
  See application file for complete search history.

(56) References Cited

U.S. PATENT DOCUMENTS

| | | | |
|---|---|---|---|
| 6,762,600 | B2 | 7/2004 | Khalfin |
| 6,841,994 | B1 | 1/2005 | Wiegert |
| 6,888,353 | B1 | 5/2005 | Wiegert |
| 7,292,948 | B2 | 11/2007 | Jones, Jr. et al. |
| 7,425,829 | B2* | 9/2008 | Zeller .................. G01D 5/2006 324/326 |
| 7,835,785 | B2 | 11/2010 | Scully et al. |
| 7,912,633 | B1 | 3/2011 | Dietsch et al. |
| 8,220,710 | B2 | 7/2012 | Hoffman et al. |
| 8,928,602 | B1 | 1/2015 | Wan |
| 9,329,599 | B1 | 5/2016 | Sun et al. |
| 9,348,009 | B2 | 5/2016 | Sontag |
| 9,459,124 | B2 | 10/2016 | Khalfin et al. |
| 10,026,001 | B2 | 7/2018 | Falconer et al. |
| 10,027,952 | B2 | 7/2018 | Karvounis |
| 10,168,393 | B2* | 1/2019 | Stetson, Jr. ........ G01R 33/0052 |
| 2006/0038555 | A1 | 2/2006 | Higgins et al. |
| 2009/0128139 | A1 | 5/2009 | Drenth et al. |
| 2010/0127696 | A1 | 5/2010 | Huber et al. |
| 2012/0277529 | A1* | 11/2012 | Popescu ............. A61B 1/00158 600/109 |
| 2014/0320394 | A1* | 10/2014 | Costanzo ............. G06F 1/1694 345/156 |
| 2015/0061648 | A1 | 3/2015 | Park et al. |
| 2016/0147231 | A1 | 5/2016 | Sun et al. |
| 2018/0011472 | A1 | 1/2018 | Sun et al. |
| 2018/0172454 | A1 | 6/2018 | Ghadiok et al. |
| 2018/0189565 | A1 | 7/2018 | Lukierski et al. |
| 2019/0078909 | A1* | 3/2019 | Luo ................... G01R 33/0206 |
| 2020/0370889 | A1* | 11/2020 | Eitel .................... G01C 21/206 |

FOREIGN PATENT DOCUMENTS

| | | |
|---|---|---|
| CN | 103288116 B | 2/2015 |
| CN | 105044630 A | 11/2015 |
| CN | 204871280 U | 12/2015 |
| CN | 107063237 A | 8/2017 |
| EP | 2 863 284 A2 | 4/2015 |
| JP | 11-304405 A | 11/1999 |
| KR | 10-2018-0079215 A | 7/2018 |
| TW | 200934710 A | 8/2009 |
| TW | M465591 U | 11/2013 |
| TW | 201407308 A | 2/2014 |
| TW | I431247 B | 3/2014 |
| TW | 201447525 A | 12/2014 |
| TW | I470386 B | 1/2015 |
| TW | 201619038 A | 5/2016 |
| TW | I582035 B | 5/2017 |
| TW | I608243 B | 12/2017 |
| TW | 201802487 A | 1/2018 |
| TW | I634404 B | 9/2018 |
| WO | WO 2018/088873 A1 | 5/2018 |

OTHER PUBLICATIONS

C. Hu (Hu, Chao et al., "A Novel Positioning and Orientation System Based on Three-Axis Magnetic Coils," IEEE Transactions on Magnetics, vol. 48, No. 7, Jul. 2012, pp. 2211-2219.). (Year: 2012).*

Marins (Marins, J. L. et al., "An Extended Kalman Filter for Quaternion-Based Orientation Estimation Using MARG Sensors," IEEE/RSJ International Conference on Intelligent Robots and Systems, Maul, Hawaii, USA. Oct. 29-Nov. 3, 2001, pp. 2003-2011.). (Year: 2001).*

Chung et al., "Indoor Location Sensing Using Geo-Magnetism," MIT Media Laboratory, pp. 141-154.

Hou et al., "Experimental Study of Magnetic-based Localization Model for Miniature Medical Device Placed Indwelling Human Body," Proceedings of the 2005 IEEE, Engineering in Medicine and Biology 27th Annual Conference, Shanghai, China, Sep. 1-4, 2005, pp. 1309-1312.

Hu et al., "A Novel Positioning and Orientation System Based on Three-Axis Magnetic Coils," IEEE Transactions on Magnetics, vol. 48, No. 7, Jul. 2012, pp. 2211-2219.

Hu et al., "A Robust Orientation Estimation Algorithm Using MARG Sensors," IEEE Transactions on Instrumentation and Measurement, vol. 64, No. 3, Mar. 2015, pp. 815-822.

Kemppainen et al., "Magnetic field SLAM exploration: frequency domain Gaussian processes and informative route planning," Department of Computer Science and Engineering, University of Oulu, Finland, 2015, 7 pages.

Le Grand et al., "3-Axis Magnetic Field Mapping and Fusion for Indoor Localization," 2012 IEEE International Conference on Multisensor Fusion and Integration for Intelligent Systems (MFI), Sep. 13-15, 2012. Hamburg, Germany, pp. 358-384.

Nara et al., "A Closed-Form Formula for Magnetic Dipole Localization by Measurement of Its Magnetic Field and Spatial Gradients," IEEE Transactions on Magnetics, vol. 42, No. 10, Oct. 2006, pp. 3291-3293.

Pang et al., "Integrated Compensation of Magnetometer Array Magnetic Distortion Field and Improvement of Magnetic Object Localization," IEEE Transactions on Geoscience and Remote Sensing, vol. 52, No. 9, Sep. 2014, pp. 5670-5676.

Skog et al., "Pedestrian tracking using an IMU array," IEEE CONECCT2014 1569825763, Department of Signal Processing, ACCESS Linnaeus Centre, KTH Royal Institute of Technology. Stockholm, Sweden, pp. 1-4.

Sun et al., "A Single Dipole-based Localization Method in Near Magnetic Field using IMU Array," 2016 IEEE International Workshop on Advanced Robotics and its Social Impacts (ARSO), Shanghai, China, Jul. 8-10, 2016, pp. 152-157.

Vallivaara et al., "Magnetic field-based SLAM method for solving the localization problem in mobile robot floor-cleaning task," The 15th International Conference on Advanced Robotics, Tallinn University of Technology, Tallinn, Estonia, Jun. 20-23, 2011, pp. 198-203.

Vallivaara et al., "Monty Hall Particle Filter: a new method to tackle predictive model uncertainties," Computer Science and Engineering Laboratory, University of Oulu, Finland, 2013, 8 pages.

Vallivaara et al., "Simultaneous Localization and Mapping Using Ambient Magnetic Field," 2010 IEEE International Conference on Multisensor Fusion and Integration for Intelligent Systems, University of Utah, Salt Lake City, UT, USA, Sep. 5-7, 2010, pp. 14-19.

Vallivaara, "Simultaneous Localization and Mapping Using the Indoor Magnetic Field," Acta Univ. Oul. C 642, 2018, pp. 1-98.

You et al., "Localization Using Magnetic Patterns for Autonomous Mobile," International Journal of Advanced Robotic Systems, 2014, 11:50, pp. 1-10.

Taiwanese Office Action and Search Report for Taiwanese Application No. 107140436, dated Jun. 3, 2019.

* cited by examiner

LOCALIZATION AND ATTITUDE ESTIMATION METHOD USING MAGNETIC FIELD AND SYSTEM THEREOF

This application claims the benefit of Taiwan application Serial No. 107140436, filed Nov. 14, 2018, the disclosure of which is incorporated by reference herein in its entirety.

TECHNICAL FIELD

This disclosure relates to a localization method and a system thereof, and more particularly to a localization and attitude estimation method using magnetic fields and a system thereof.

BACKGROUND

An automated guided vehicle (AGV) is an important carrier in automated material transfer field. Compared with the conventional transfer method using a conveyor belt, the AGV has the advantages of occupying less space and more flexibly adjusting in the production line. For the trackless guided AGV, the localization of the existing AGV is normally achieved through a laser reflective label, a magnetic lamdmark, a two-dimensional bar code label or the like. However, when the label localization technology is actually used, the space site needs to be emptied in advance. So, it is hard to be used for those plants lack of pre-planning site. In addition, the label localization technology is limited to the two-dimensional condition, and thus cannot be applied to a three-dimensional localization system. Also, the label localization technology cannot judge the attitude of the object in the three-dimensional space, and therefore needs to be improved.

SUMMARY

This disclosure is directed to a localization and attitude estimation method using magnetic fields and a system thereof, and the position information of magnetic landmarks and magnetic sensors may be obtained by analyzing the magnetic fields of multiple magnetic landmarks in a three-dimensional space.

According to one embodiment of this disclosure, a localization and attitude estimation method using magnetic fields is provided. The method includes the following steps. First, at least three magnetic landmarks arbitrarily disposed around a moving carrier in three-dimensional coordinates are selected, wherein any two of the at least three magnetic landmarks have different magnetic directions. Position information and magnetic moment information of the at least three magnetic landmarks in the three-dimensional coordinates are unknown information. One set of at least five tri-axes magnetic sensors is used to sense the magnetic fields of the at least three magnetic landmarks, and three magnetic components on three axes of a current position of each of the tri-axes magnetic sensors are respectively generated using a demagnetization method, wherein spatial distributions of the set of at least five tri-axes magnetic sensors are not located on a same plane. Five non-linear magnetic equations are obtained according to the three magnetic components on the three axes of the current position of each of the tri-axes magnetic sensor. Then, the five non-linear magnetic equations are solved according to magnetic moment vectors of the at least three magnetic landmarks in a null space to obtain the position information and the magnetic moment information of the at least three magnetic landmarks in the three-dimensional coordinates. In addition, position vectors and attitude vectors of the set of at least five tri-axes magnetic sensors in the three-dimensional coordinates are estimated according to tri-axes magnetic moment vectors of the at least three magnetic landmarks.

According to another embodiment of this disclosure, a localization and attitude estimation system using magnetic fields is provided to localize a moving carrier. The localization and attitude estimation system includes at least three magnetic landmarks, one set of at least five tri-axes magnetic sensors and a logic operation processing unit. At least three magnetic landmarks are arbitrarily disposed around the moving carrier in three-dimensional coordinates, wherein any two of the at least three magnetic landmarks have different magnetic directions. The set of at least five tri-axes magnetic sensors is disposed on the moving carrier, wherein spatial distributions of the set of at least five tri-axes magnetic sensors are not located on a same plane. The logic operation processing unit is connected to the set of at least five tri-axes magnetic sensors. The set of at least five tri-axes magnetic sensors senses the magnetic fields of the at least three magnetic landmarks, and generates at least fifteen sets of magnetic field information to the logic operation processing unit. The logic operation processing unit estimates position vectors and attitude vectors of the set of at least five tri-axes magnetic sensors in the three-dimensional coordinates according to tri-axes magnetic moment vectors of the at least three magnetic landmarks sensed by each of the tri-axes magnetic sensors.

The above and other aspects of this disclosure will become understood with regard to the following detailed description of the preferred but non-limiting embodiments. The following description is made with reference to the accompanying drawings.

Figure 1:
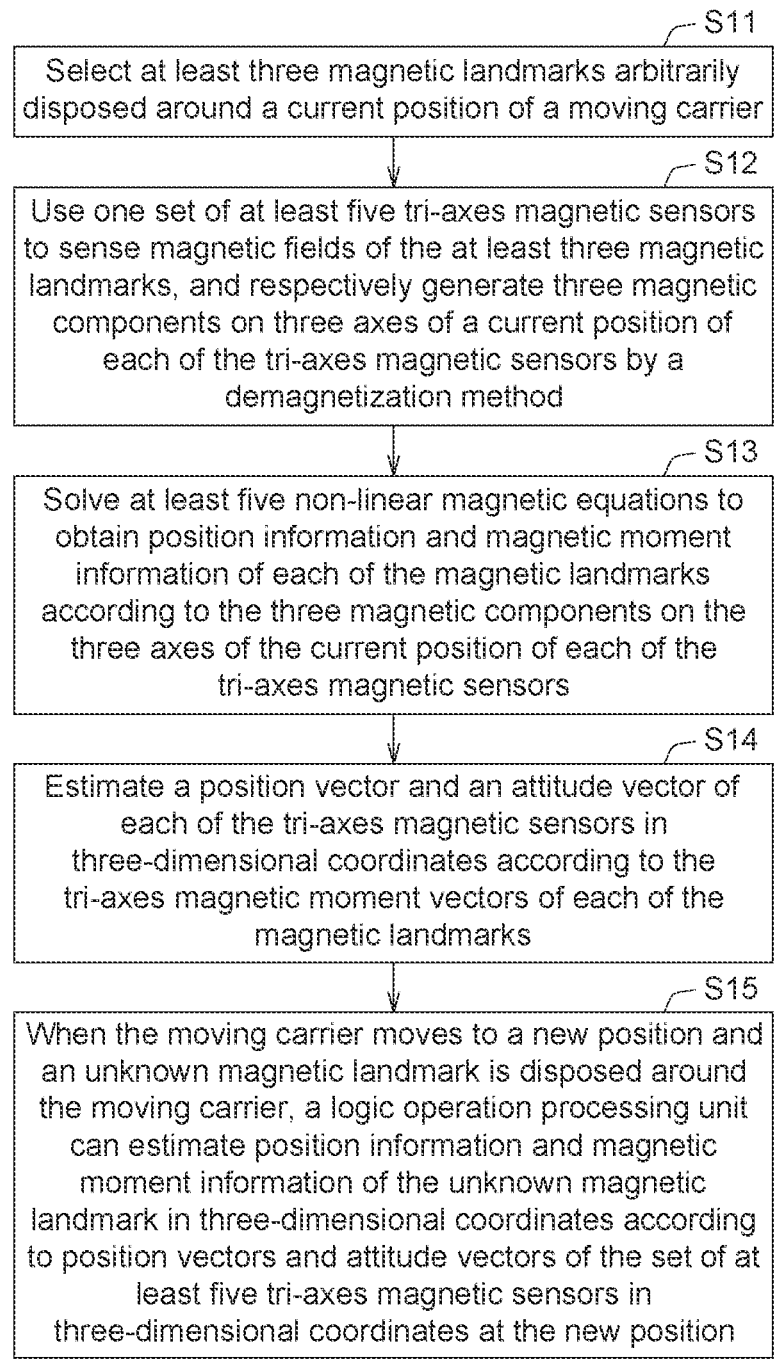
FIG. 1 is a flow chart showing a localization and attitude estimation method using magnetic fields according to an embodiment of this disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

The embodiments are described in detail as below, and the examples are only intended to be illustrative and not intended to limit the scope of this disclosure. In the following illustration, the same/similar symbols represent the same/similar elements. Directional terms, such as up, down, left, right, front, back and the like, mentioned in the following examples, only refer to the directions of the drawings. Therefore, the directional terms are used to describe but not to limit this disclosure.

Figure 2:
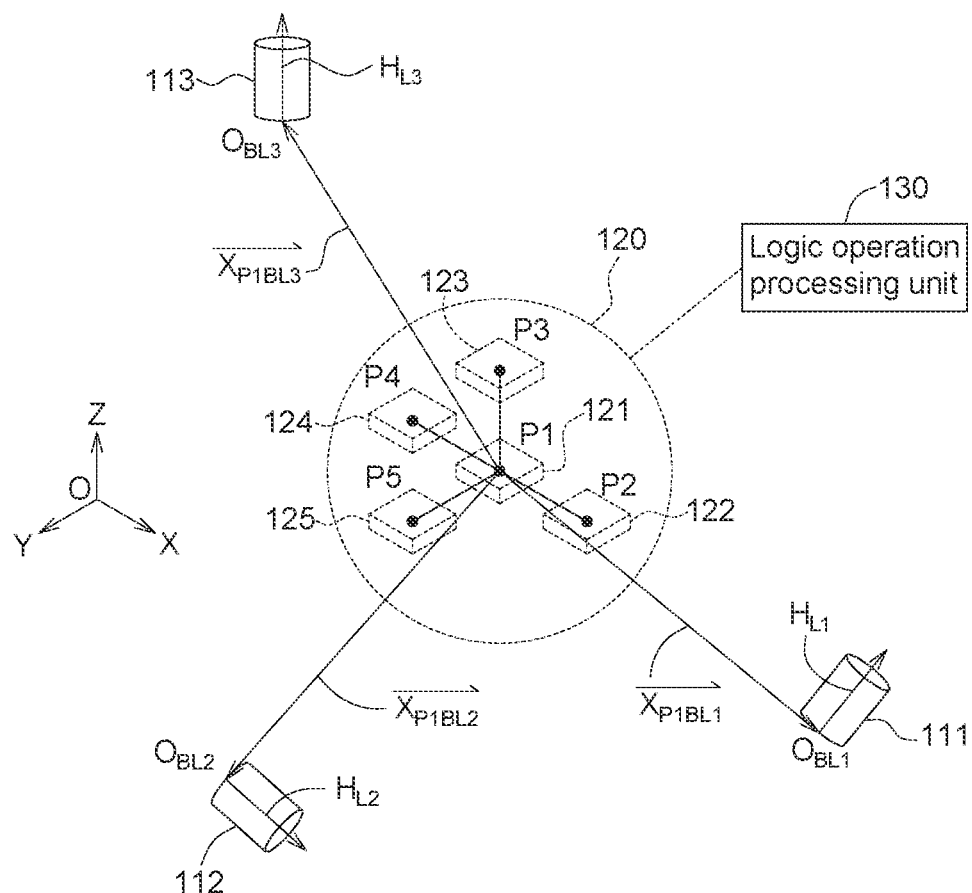
FIG. 2 is a schematic view showing a localization and attitude estimation system using magnetic fields according to an embodiment of this disclosure.

Referring to FIGS. 1 and 2, a localization and attitude estimation method using magnetic fields according to an embodiment of this disclosure includes the following steps S11 to S15 and can be used to localize a moving carrier 120. The moving carrier 120 may be, for example, an automated guided vehicle, an unmanned vehicle, an unmanned aircraft or the like. The moving carrier 120 can arbitrarily move in a three-dimensional space, and one set of at least five td-axes magnetic sensors 121 to 125 is disposed on the moving carrier 120, wherein three-dimensional coordinate points P1 to P5 of the set of at least five tri-axes magnetic sensors 121 to 125 are not located on the same plane. That is, at least one point of the three-dimensional coordinate points P1 to P5 is not co-planar with other points. Referring to FIG. 2, a localization and attitude estimation system 100 includes at least three magnetic landmarks 111 to 113, one set of at least five tri-axes magnetic sensors 121 to 125 and a logic operation processing unit 130.

The number of the magnetic landmarks 111 to 113 is not restricted, and may be an arbitrary number equal to or greater than 3. The magnetic landmarks 111 to 113 may be disposed in an area around the moving carrier 120, such as the ground, walls or any point in the three-dimensional space. When the moving carrier 120 moves to a current position, at least three magnetic landmarks 111 to 113 arbitrarily disposed around the current position of the moving carrier 120 are selected as the magnetic landmarks for localization. When the moving carrier 120 moves to a new position, at least three magnetic landmarks 111 to 113 disposed around the new position of the moving carrier 120 may be selected as the magnetic landmarks for localization, and so on.

The logic operation processing unit 130 may be, for example, a computer or a single-chip microprocessor disposed in the computer, or may include a computer program stored in a computer readable recording medium. In another embodiment, the logic operation processing unit 130 can be disposed on the moving carrier 120. Before the logic operation processing unit 130 receives magnetic field information, noise in the magnetic field information may be reduced through a low-pass filter, and the signal to noise ratio is increased. Then, the magnetic field information may be converted into digital magnetic field information through an analog/digital converter.

Referring to FIGS. 1 and 2, in the step S11, in three-dimensional coordinates (X, Y, Z), at least three magnetic landmarks 111 to 113 arbitrarily disposed around the current position of the moving carrier 120 are selected. any two magnetic landmarks of the at least three magnetic landmarks 111 to 113 have different magnetic directions, and position vectors (relative to the original O) and attitude vectors of the at least three magnetic landmarks 111 to 113 in the three-dimensional coordinates (X, Y, Z) are unknown vectors. That is, it is unnecessary to establish the map of the magnetic landmarks 111 to 113 in advance. In this embodiment, single-magnetic-moment electronic magnet landmarks are taken as examples, and each of the magnetic landmarks 111 to 113 is, for example, an active variable frequency magnetic generating element for generating magnetic signals with different constant frequencies. Sine waves with different constant frequencies are respectively inputted to the magnetic landmarks 111 to 113 to facilitate the subsequent demagnetization.

In one embodiment, the at least three magnetic landmarks 111 to 113 do not located at the same point in the three-dimensional coordinates (X, Y, Z) and are not restricted to be orthogonal to one another. That is, the three magnetic landmarks 111 to 113 need not to be restricted to be orthogonal to one another and located at the same point as long as the sum of any two of magnetic field vectors is unequal to the multiple of the other one of the magnetic field vectors, so that the flexibility of the system is enhanced.

Referring to FIGS. 1 and 2, in the step S12, the set of at least five tri-axes magnetic sensors 121 to 125 is used to sense magnetic fields of the at least three magnetic landmarks 111 to 113 to obtain a sum of the magnetic field vectors of the at least three magnetic landmarks 111 to 113, and the subsequent demagnetization process can be performed.

In this embodiment, each of the tri-axes magnetic sensors 121 to 125 is connected to the logic operation processing unit 130, to generate at least three sets of magnetic field information to the logic operation processing unit 130, and thus at least fifteen sets of magnetic field information may be provided to the logic operation processing unit 130. In order to facilitate calculation of magnetic field components of the at least three magnetic landmarks 111 to 113, magnetic fields of the three magnetic landmarks 111 to 113 may be separated using a demagnetization method, wherein each of the magnetic sensors obtains the sum of the magnetic field vectors of the three magnetic landmarks 111 to 113, and the sum of the magnetic field vectors $B_{S1}, B_{S2}, \ldots, B_{SN}$ is expressed as follows, N is an integer equal to 5 or greater than 5:

$$B_{S1} = [\begin{array}{ccc} B_{S1x} & B_{S1y} & B_{S1z} \end{array}]^T, \qquad (1)$$
$$B_{S2} = [\begin{array}{ccc} B_{S2x} & B_{S2y} & B_{S2z} \end{array}]^T,$$
$$\ldots$$
$$B_{SN} = [\begin{array}{ccc} B_{SNx} & B_{SNy} & B_{SNz} \end{array}]^T$$

Next, the logic operation processing unit 130 may use the demagnetization method of a band pass filter to obtain three magnetic components of magnetic field vectors having different constant frequencies on three axes of the current position of each of the tri-axes magnetic sensors 121 to 125, which are respectively expressed as $B_{S1}', B_{S2}', \ldots, B_{SN}'$, where $$B'_{S1} = \sum_{i=1}^{NL} B'_{S1Li}, \qquad (2)$$
$$B'_{S2} = \sum_{i=1}^{NL} B'_{S2Li},$$
$$\ldots$$
$$B'_{SN} = \sum_{i=1}^{NL} B'_{SNLi}$$

The demagnetization method includes using an extended Kalman filter having three different constant frequencies functioning as restriction items to resolve waveforms and amplitudes of the at least three magnetic landmarks 111 to 1113 and obtain at least three sets of waveforms and amplitudes as the three magnetic components of the at least three magnetic landmarks 111 to 113 on the three axes of the three-dimensional coordinates (X, Y, Z). Next, in the step S13, for the same magnetic landmark, the position vector and the attitude vector of each of the magnetic landmarks 111 to 113 may be obtained through the following steps.

The magnetic field of each of the magnetic landmarks is known as $$B = B_T \left( \frac{3(H \cdot X)X}{R^5} - \frac{H}{R^3} \right) \quad (3)$$

where $X=P-O_B$, $R=|X|$, $|H|=1$, P is a position of a single tri-axes magnetic sensor, $O_B$ is a position of a single magnetic landmark, H is a magnetic moment unit vector of the single magnetic landmark, X is a position vector of the single tri-axes magnetic sensor relative to each of the magnetic landmarks, and R is an absolute value of the position vector X (i.e., a distance). In FIG. 2, the tri-axes magnetic sensors 121 to 125 are respectively placed on the X axis, the Y axis, the Z axis and the original O of a sensor coordinate system, and the distance between each of the tri-axes magnetic sensors 121 to 125 and the original O is known (this is the pervious speculated result). So, in the Equation (3), P and B are known, but $O_B$, H and $B_T$ are unknown.

In addition, the magnetic field of each of the magnetic landmarks 111 to 113 is a closed curve, and the magnetic force lines are not interlaced. So, a magnetic field vector and a magnetic moment and a displacement vector of each point on each magnetic force line are disposed on the same plane, and an inner product space thereof is null, that is, $B \times X \cdot H=0$. According to the above-mentioned $X=P-O_B$, $B \times P \cdot H + H \times O_B \cdot B = 0$ may be obtained. Rearrange the above results can obtain $$\begin{bmatrix} B^T & (B \times P)^T \end{bmatrix} \begin{bmatrix} H \times O_B \\ H \end{bmatrix} = 0.$$

For all tri-axes magnetic sensors 121 to 125, at least five non-linear magnetic equations may be obtained as follows according to the three magnetic components on the three axes of the current position of each of the tri-axes magnetic sensors 121 to 125, $$\begin{bmatrix} B_{s1Li}^T & (B_{s1Li} \times P_1)^T \\ B_{s2Li}^T & (B_{s2Li} \times P_2)^T \\ \vdots & \vdots \\ B_{sNLi}^T & (B_{sNLi} \times P_N)^T \end{bmatrix} \begin{bmatrix} H_{Li} \times O_{BLi} \\ H_{Li} \end{bmatrix} = 0$$

According to the above-mentioned relationship, it is obtained that $$\begin{bmatrix} H_{Li} \times O_{BLi} \\ H_{Li} \end{bmatrix} \in \mathbb{R}^{1 \times 6},$$

the above-mentioned five non-linear magnetic equations are solved according to magnetic moment vectors of the at least three magnetic landmarks 111 to 113 in a null space, and the unit vector of the null space may be determined. The calculation process is as follows. Firstly, let the null space be $$V = \begin{bmatrix} H_{Li} \times O_{BLi} \\ H_{Li} \end{bmatrix},$$

then $H_{Li}=V(4:6)$. Let $r=H_{Li} \times O_{BLi}=V(1:3)$, and $O_{BLi}=r \times H_{Li}+tH_{Li}$, and substitute $O_{BLi}$ back to Equation (3), so that the parameter t can be solved, and $O_{BLi}$ is obtained. $B_T$ is determined according to $O_{BLi}$ and $H_{Li}$. If $B_T$ is negative, then $H_{Li}$ is multiplied by a minus sign.

According to the above-mentioned results, the logic operation processing unit 130 may obtain the position information and the magnetic moment information (i.e., $O_{BLi}$ and $H_{Li}$) of the at least three magnetic landmarks 111 to 113 in the three-dimensional coordinates (X, Y, Z). As shown in FIG. 2, the position information and the magnetic moment information of the magnetic landmark 111 are $O_{BL1}$ and $H_{L1}$, the position information and the magnetic moment information of the magnetic landmark 112 are $O_{BL2}$ and $H_{L2}$, the position information and the magnetic moment information of the magnetic landmark 113 are $O_{BL3}$ and $H_{L3}$.

Next, in the step S14, after the position information and the magnetic moment information of the at least three magnetic landmarks 111 to 113 are obtained, the position vector of each of the tri-axes magnetic sensors 121 to 125 relative to the each of the magnetic landmarks 111 to 113 can be obtained according to Equation (1), and the attitude vector of each of the tri-axes magnetic sensors 121 to 125 in the three-dimensional coordinates (X, Y, Z) can be estimated according to the tri-axes magnetic moment vector of each of the three magnetic landmarks 111 to 113 sensed by each of the tri-axes magnetic sensors 121 to 125.

As shown in FIG. 2, where $\overrightarrow{X_{P1BL1}}$ represents the position vector of the tri-axes magnetic sensor 121 relative to the magnetic landmark 111, $\overrightarrow{X_{P1BL2}}$ represents the position vector of the tri-axes magnetic sensor 121 relative to the magnetic landmark 112, and $\overrightarrow{X_{P1BL3}}$ represents the position vector of the tri-axes magnetic sensor 121 relative to the magnetic landmark 113. The position vectors of other magnetic sensors 122 to 125 are similar will not be depicted again.

Next, in the step S15, an magnetic moment pointing matrix of the current magnetic landmark is $[H_{L1} \; H_{L2} \; \ldots \; H_{LN}]=H_L$. If an initial state matrix is known as $H_0$, then the current rotation matrix relative to the initial state is $R=(H_0 H_L^T (H_L H_L^T)^{-1})$. Any current position of the magnetic landmark is $o_B$. If the initial position of the magnetic landmark is known as $o_{B_0}$, then the original position of the current sensor array system in the initial coordinates is $P_{Global}=R^T(-o_B)+o_{B_0}$.

After $P_{Global}$ and R are obtained, the magnetic moment information $H_L$ and the position information $O_B$ of a unknown magnetic landmark relative to $H_{L0}$ and $O_{B0}$ of the initial coordinate system can be calculated according to the following equations, and the magnetic moment information $H_L$ and position information $O_B$ can be recorded, where $$O_{B0}=R^T O_B + P_{Global}$$

$$H_{L0}=R^T H_L$$

That is, in the step S15, when the moving carrier 120 moves to a new position A (see FIG. 3) and an unknown magnetic landmark 114 is disposed around the moving carrier 120, the logic operation processing unit 130 may estimate the position information and the magnetic moment information of the unknown magnetic landmark 114 in the three-dimensional coordinates according to the position vectors and the attitude vectors of the set of at least five tri-axes magnetic sensors 121 to 125 at the new position A in the three-dimensional coordinates (X, Y, Z).

Figure 3:
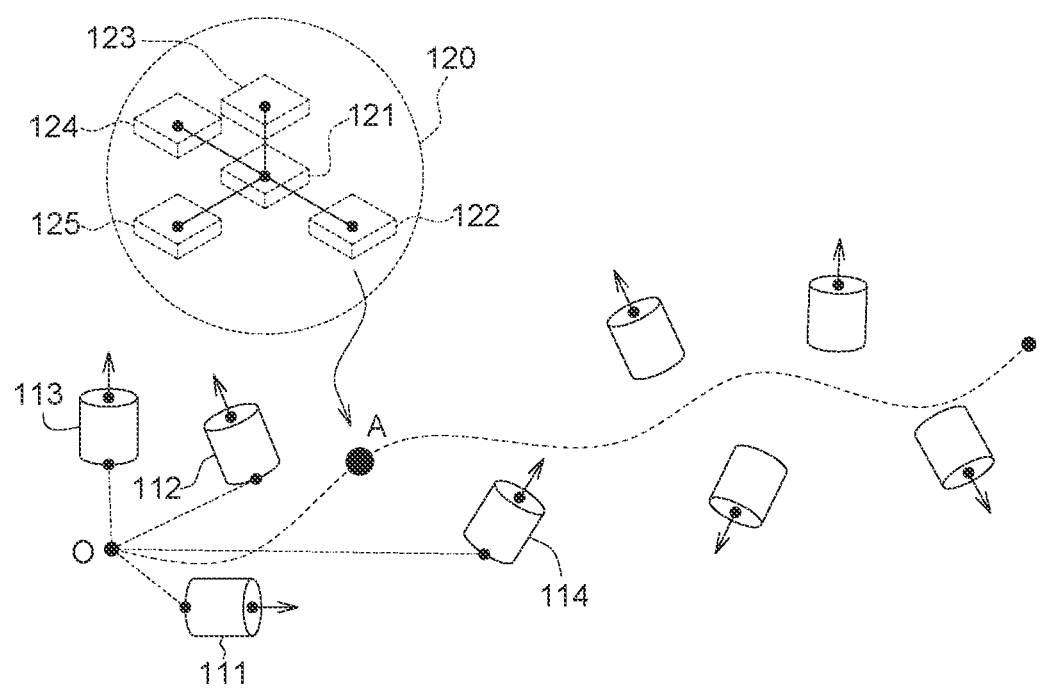
FIG. 3 is a schematic view showing that the tri-axes magnetic sensors select one unknown magnetic landmark and obtain position information and magnetic moment information of the unknown magnetic landmark in three-dimensional coordinates.

Referring to FIG. 3, because magnetic fields generated by the magnetic landmarks descend with the sensing distance, when the distance of at least one of the magnetic landmarks exceeds a predetermined range, the tri-axes magnetic sensors 121 to 125 cannot sense changes in the magnetic field of the at least one of the magnetic landmarks. Therefore, the localization and attitude estimation system 100 of this embodiment can estimate the position vectors and the attitude vectors of the set of at least five tri-axes magnetic sensors 121 to 125 in the three-dimensional coordinates by selecting an unknown new magnetic landmark 114, and obtaining position information and magnetic moment information of the new magnetic landmark 114 in the three-dimensional coordinates by way of calculation.

Figure 4:
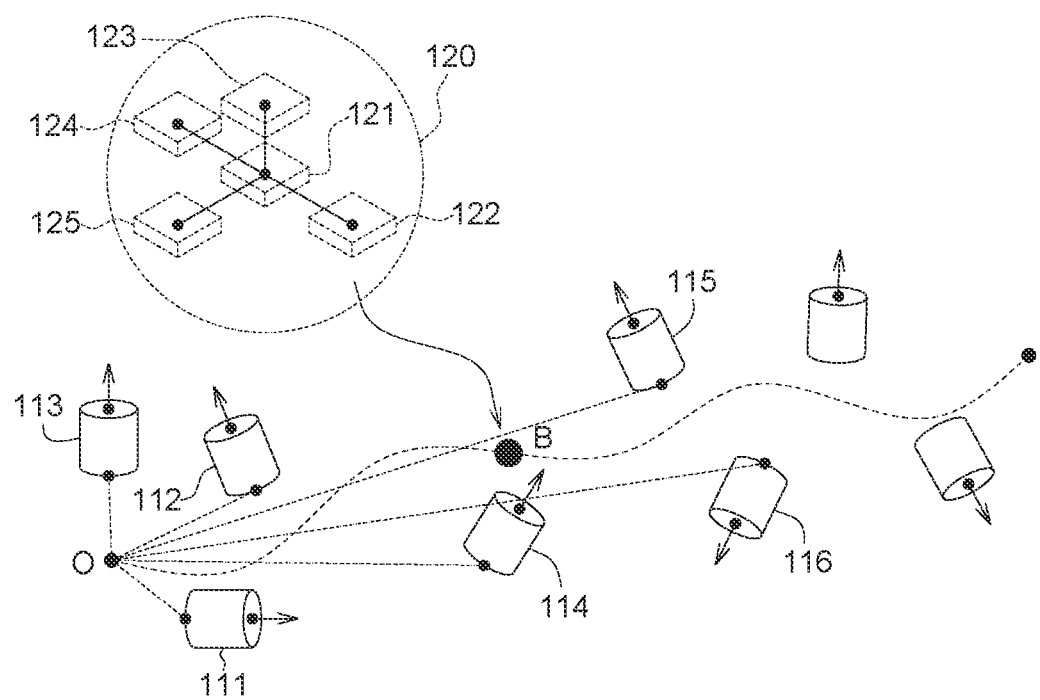
FIG. 4 is a schematic view showing that the tri-axes magnetic sensors reselect other three unknown magnetic landmarks and obtain position information and magnetic moment information of the three magnetic landmarks in three-dimensional coordinates.

Alternatively, in FIG. 4, when the moving carrier 120 moves to a new position B, other three unknown magnetic landmarks 114, 115 and 116 may be selected, and position information and magnetic moment information of the three magnetic landmarks 114 to 116 in the three-dimensional coordinates are obtained through calculations of the above process steps S11 to S14 to estimate the position vectors and the attitude vectors of the set of at least five tri-axes magnetic sensors 121 to 125 in the three-dimensional coordinates.

The localization and attitude estimation method using magnetic fields and the system thereof disclosed by the above-mentioned embodiment of this disclosure may be used to detect the position and the attitude of the moving carrier (such as the unmanned vehicle or the arbitrary object) in the space, and the position of the magnetic landmark may be arbitrarily placed without establishing the map in advance to reduce the data quantity and the computation amount for the map. Therefore, this disclosure does not require site layout of the environment in advance, so that the localization system is more flexible and the localization range is wider, and the mobility and convenience of the site layout are possessed.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A localization and attitude estimation method using magnetic fields to localize a moving carrier, on which one set of at least five tri-axes magnetic sensors is disposed, the localization and attitude estimation method comprising:

selecting at least three magnetic landmarks arbitrarily disposed around the moving carrier in three-dimensional coordinates, wherein any two of the at least three magnetic landmarks have different magnetic directions, wherein position information and magnetic moment information of the at least three magnetic landmarks in the three-dimensional coordinates are unknown information;

using the set of at least five tri-axes magnetic sensors to sense the magnetic fields of the at least three magnetic landmarks, and respectively generating three magnetic components on three axes of a current position of each of the tri-axes magnetic sensors using a demagnetization method, wherein three-dimensional coordinates of the set of at least five tri-axes magnetic sensors are not located on a same plane;

obtaining five non-linear magnetic equations according to the three magnetic components on the three axes of the current position of each of the tri-axes magnetic sensors, and then solving the five non-linear magnetic equations according to magnetic moment vectors of the at least three magnetic landmarks in a null space to obtain the position information and the magnetic moment information of the at least three magnetic landmarks in the three-dimensional coordinates, and estimating position vectors and attitude vectors of the set of at least five tri-axes magnetic sensors in the three-dimensional coordinates according to tri-axes magnetic moment vectors of the at least three magnetic landmarks, and estimating position information and magnetic moment information of at least one unknown magnetic landmark in the three-dimensional coordinates according to the position vectors and the attitude vectors of the set of at least five tri-axes magnetic sensors at a new position in the three-dimensional coordinates when the moving carrier moves to the new position, when a distance of at least one of the three landmarks exceeds a predetermined range from the moving carrier and the at least one unknown magnetic landmark is disposed around the moving carrier, the method re-estimates the position vectors and the attitude vectors of the set of at least five tri-axes magnetic sensors in the three-dimensional coordinates by selecting the at least one unknown magnetic landmark, and obtaining position information and magnetic moment information of the at least one unknown magnetic landmark in the three-dimensional coordinates.

2. The localization and attitude estimation method according to claim 1, wherein the demagnetization method comprises:

using a band pass filter to divide the magnetic fields of the at least three magnetic landmarks into the three magnetic components on the three axes of the three-dimensional coordinates; and using an extended Kalman filter having three different constant frequencies functioning as restriction items to resolve waveforms and amplitudes of the at least three magnetic landmarks and obtain at least three sets of waveforms and amplitudes as the three magnetic components of the at least three magnetic landmarks on the three axes of the three-dimensional coordinates.

3. A localization and attitude estimation system using magnetic fields to localize a moving carrier, the localization and attitude estimation system comprising:

at least three magnetic landmarks arbitrarily disposed around the moving carrier in three-dimensional coordinates, wherein any two of the at least three magnetic landmarks have different magnetic directions;

one set of at least five tri-axes magnetic sensors disposed on the moving carrier, wherein three-dimensional coordinates of the set of at least five tri-axes magnetic sensors are not located on a same plane; and a logic operation processing unit connected to the set of at least five tri-axes magnetic sensors, wherein the set of at least five tri-axes magnetic sensors senses the magnetic fields of the at least three magnetic landmarks, and generates at least fifteen sets of magnetic field information to the logic operation processing unit, the logic operation processing unit estimates position vectors and attitude vectors of the set of at least five tri-axes magnetic sensors in a three-dimensional coordinates according to tri-axes magnetic moment vectors of the at least three magnetic landmarks sensed by each of the tri-axes magnetic sensors, when the moving carrier moves to a new position and at least one unknown magnetic landmark is disposed around the moving carrier, the logic operation processing unit estimates and records position information and magnetic moment information of the at least one unknown magnetic landmark in the three-dimensional coordinates in the logic operation processing unit according to the position vectors and the attitude vectors of the set of at least five tri-axes magnetic sensors at the new position, when a distance of at least one of the three magnetic landmarks exceeds a predetermined range from the moving carrier and the at least one unknown magnetic landmark is disposed around the moving carrier, the logic operation processing unit re-estimates the position vectors and the attitude vectors of the set of at least five tri-axes magnetic sensors in the three-dimensional coordinates by selecting the at least one unknown magnetic landmark, and obtaining position information and magnetic moment information of the at least one unknown magnetic landmark in the three-dimensional coordinates.

4. The localization and attitude estimation system according to claim 3, wherein the logic operation processing unit comprises a single-chip microprocessor.

5. The localization and attitude estimation system according to claim 3, wherein the logic operation processing unit uses a band pass filter to divide the magnetic fields of the at least three magnetic landmarks into three magnetic components on three axes of the three-dimensional space, and uses an extended Kalman filter having three different constant frequencies functioning as restriction items to resolve waveforms and amplitudes of the at least three magnetic landmarks, and obtain at least three sets of waveforms and amplitudes as the three magnetic components of the at least three magnetic landmarks on the three axes of the three-dimensional coordinates.

6. The localization and attitude estimation system according to claim 3, wherein each of the magnetic landmarks comprises an active variable frequency magnetic generating element.

* * * * *